(12) United States Patent
Nakagawa et al.

(10) Patent No.: US 11,329,764 B2
(45) Date of Patent: May 10, 2022

(54) ERROR CORRECTION DEVICE, ERROR CORRECTION METHOD, AND OPTICAL COMMUNICATION SYSTEM

(71) Applicants: NTT ELECTRONICS CORPORATION, Kanagawa (JP); NIPPON TELEGRAPH AND TELEPHONE CORPORATION, Tokyo (JP)

(72) Inventors: Fumiaki Nakagawa, Kanagawa (JP); Yasuharu Onuma, Kanagawa (JP); Katsuichi Oyama, Kanagawa (JP); Yasuyuki Endoh, Kanagawa (JP); Etsushi Yamazaki, Tokyo (JP); Yoshiaki Kisaka, Tokyo (JP); Masahito Tomizawa, Tokyo (JP)

(73) Assignees: NTT ELECTRONICS CORPORATION, Kanagawa (JP); NIPPON TELEGRAPH AND TELEPHONE CORPORATION, Tokyo (JP)

( * ) Notice: Subject to any disclaimer, the term of this patent is extended or adjusted under 35 U.S.C. 154(b) by 98 days.

(21) Appl. No.: 16/955,676
(22) PCT Filed: Dec. 20, 2018
(86) PCT No.: PCT/JP2018/046934
§ 371 (c)(1),
(2) Date: Jun. 18, 2020
(87) PCT Pub. No.: WO2019/124481
PCT Pub. Date: Jun. 27, 2019

(65) Prior Publication Data
US 2021/0075541 A1 Mar. 11, 2021

(30) Foreign Application Priority Data
Dec. 20, 2017 (JP) .............................. JP2017-243695

(51) Int. Cl.
*H04L 1/00* (2006.01)
*H04B 10/80* (2013.01)
(Continued)

(52) U.S. Cl.
CPC .......... *H04L 1/0061* (2013.01); *H03M 13/47* (2013.01); *H04B 10/616* (2013.01); *H04B 10/80* (2013.01);
(Continued)

(58) Field of Classification Search
CPC ....... H04L 1/0061; H04L 1/00; H04L 1/0051; H04L 1/0053; H03M 13/47; H04B 10/616; H04B 10/80; H04B 2210/003
See application file for complete search history.

(56) References Cited

U.S. PATENT DOCUMENTS 10,461,888 B2 * 10/2019 Kang ..................... H04L 1/0045
10,887,048 B2 * 1/2021 Paycher .................... H04L 1/18
(Continued)

FOREIGN PATENT DOCUMENTS

| CN | 101902641 A | 12/2010 |
| EP | 2256936 A2 | 12/2010 |

(Continued)

OTHER PUBLICATIONS

S. Zahedi and J. A. Salehi, "Performance analysis for various fiber-optic CDMA receiver structures," Globecom '00—IEEE. Global Telecommunications Conference. Conference Record (Cat. No. 00CH37137), San Francisco, CA, USA, 2000, pp. 1210-1215 vol. 2. (Year: 2000).*

(Continued)

*Primary Examiner* — Cynthia Britt
(74) *Attorney, Agent, or Firm* — Womble Bond Dickinson (US) LLP (57) ABSTRACT

An error correction device includes a first correction unit which performs error correction decoding of data by a repetitive operation, having a full operation state in which the error correction decoding is repeated until convergence is obtained and a save operation state in which the number
(Continued)

of times of the repetitive operation is restricted to a predetermined number. An error information estimation unit estimates an input error rate or an output error rate of the first correction unit using a decoding result of the first correction unit, and a control unit which controls transition between the full operation state and the save operation state based on at least one piece of information of the input error rate, the output error rate, and an operation time of the first correction unit. It is thus possible to provide an error correction device that can improve a transmission characteristic while suppressing power consumption.

20 Claims, 8 Drawing Sheets (51) Int. Cl.
    *H04B 10/61*     (2013.01)
    *H03M 13/47*     (2006.01)
(52) U.S. Cl.
    CPC .............. *H04L 1/00* (2013.01); *H04L 1/0051* (2013.01); *H04L 1/0053* (2013.01)

(56) References Cited

U.S. PATENT DOCUMENTS

| | | | |
|---|---|---|---|
| 2003/0106014 A1* | 6/2003 | Dohmen | H03M 13/1535 714/785 |
| 2009/0094470 A1 | 4/2009 | Gao et al. | |
| 2010/0306615 A1 | 12/2010 | Kishimoto et al. | |
| 2017/0005674 A1 | 1/2017 | Hussain et al. | |
| 2021/0182077 A1* | 6/2021 | Chen | G06Q 30/0271 |

FOREIGN PATENT DOCUMENTS

| | | |
|---|---|---|
| JP | 2007-081640 A | 3/2007 |
| JP | 2008-544692 A | 12/2008 |
| JP | 2010-278910 A | 12/2010 |
| JP | 2013-546039 A | 12/2013 |
| JP | 2016-192747 A | 11/2016 |
| WO | 2006/001052 A1 | 1/2006 |
| WO | 2007/001304 A1 | 1/2007 |

OTHER PUBLICATIONS

Gilbert et al., "Low Power Implementation of a Turbo-Decoder on Programmable Architectures", Proceedings of the ASP-DAC 2001, Asia and South Pacific Design Automation Conference 2001 (Cat. No. 01EX455), Feb. 2001, pp. 400-403.

Office Action received for Japanese Patent Application No. 2017-243695, dated Sep. 14, 2018, 16 pages (8 pages of English Translation and 8 pages of Office Action).

International Preliminary Report on Patentability received for PCT Patent Application No. PCT/JP2018/046934, dated Jul. 2, 2020, 13 pages (8 pages of English Translation and 5 pages of Original Document).

International Search Report and Written Opinion received for PCT Patent Application No. PCT/JP2018/046934, dated Jan. 22, 2019, 13 pages (7 pages of English Translation and 6 pages of Original Document).

\* cited by examiner

ERROR CORRECTION DEVICE, ERROR CORRECTION METHOD, AND OPTICAL COMMUNICATION SYSTEM

TECHNICAL FIELD

The present invention relates to an error correction device that can improve a transmission characteristic while suppressing power consumption in a coherent optical communication system.

BACKGROUND ART

In coherent optical communication, to improve a transmission characteristic, a distortion and frequency/phase fluctuations occurring during transmission are compensated by digital signal processing. To further improve the transmission characteristic, an error correction function is provided between transmission and reception apparatuses in addition to a compensation function to make an attempt to reduce a data error in the transmission characteristic. To implement this error correction function, coding for error correction is performed for data on the transmission side, and error correction decoding is performed on the reception side in correspondence with coding.

To further increase a transmission rate and extend a relay distance, it is necessary to use an error correction circuit with a higher error correction capability. However, the error correction circuit with a higher error correction capability is generally large in circuit scale and is greater in power consumption, and such greater power consumption cannot be ignored as compared with those of other circuits. Especially, in recent years, a method of obtaining a high error correction capability by performing error correction decoding by a repetitive operation, such as LDPC (Low Density Parity Check) or turbo coding, has received attention, and is applied to a high-speed data transmission system. In this method, as the number of times of the repetitive operation increases, the error correction capability becomes higher and power consumption becomes greater.

When the error rate of data input to the error correction circuit does not exceed the error correction capability of the error correction circuit, error correction works well. On the other hand, in a status in which the error rate of the input data exceeds the correction capability, even if an operation for decoding is repeatedly performed, error correction does not work well, and a state in which power consumption is always high unwantedly continues.

As a method of reducing power consumption by controlling an operation in error correction, there are proposed, for example, a method of suppressing power consumption by stopping the repetitive operation when error correction does not work well even if decoding by the repetitive operation is performed, and a method of controlling the frequency of decoding based on information representing the communication status. There is also proposed a method of controlling, based on a decoding result of error correction, an operation amount necessary for error correction decoding processing (for example, see patent literatures 1 to 4).

RELATED ART LITERATURE

Patent Literature

Patent Literature 1: Japanese Patent Laid-Open No. 2008-544692
Patent Literature 2: Japanese Patent Laid-Open No. 2007-81640
Patent Literature 3: Japanese Patent Laid-Open No. 2010-278910
Patent Literature 4: Japanese Patent Laid-Open No. 2016-192747

DISCLOSURE OF INVENTION

Problem to be Solved by the Invention

However, in the method of stopping the repetitive operation, as disclosed in patent literature 1 or 2, it is possible to reduce power consumption but it may be impossible to ensure a desired error rate. As described in patent literature 3, in the method of controlling the frequency of decoding based on information representing a communication status, an additional structure for obtaining the communication status will be required, and thus the reduction of power consumption may be hindered.

In the method described in patent literature 4, a plurality of error correction devices are provided and an operation amount in error correction on one side is controlled based on a decoding result of error correction on the other side. This method prevents power consumption of an apparatus from increasing more than necessary by decreasing the operation amount in excessive error correction in a low-loss transmission path. In a communication status in which the error correction capability is exceeded, it may be impossible to prevent an increase in power consumption by the repetitive operation. As described above, the techniques of reducing power consumption in the conventional error correction methods have advantages and disadvantages, and optimization of reduction of power consumption and error correction cannot be implemented.

The present invention has been made in consideration of the above problems, and has as its object to provide an error correction device that can improve a transmission characteristic while suppressing power consumption.

Means of Solution to the Problem

In order to solve the above problems, according to the present invention, there is provided an error correction device including a first correction unit configured to perform error correction decoding of data by a repetitive operation, including a full operation state in which the repetitive operation of the error correction decoding is repeated until convergence is obtained and a save operation state in which the number of times of the repetitive operation of the error correction decoding is settable to a predetermined number of times as needed, and the number of times of the repetitive operation of the error correction decoding is restricted, as compared with that of the full operation state, an error information estimation unit configured to estimate, using a decoding result of the first correction unit, an input error rate of the first correction unit and/or an output error rate indicating a residual error that cannot be corrected, and a control unit configured to control transition between the full operation state and the save operation state of the first correction unit based on at least one piece of information of the input error rate, the output error rate, and an operation time of the first correction unit, wherein, in the full operation state, when at least one of a condition that the input error rate exceeds a predetermined value and a condition that the output error rate exceeds a predetermined value is satisfied, the control unit causes the first correction unit to transition from the full operation state to the save operation state, when the repetitive operation of the decoding is performed in the save operation state, when at least one of a condition that the input error rate is smaller than the predetermined value, a condition that the output error rate is smaller than the predetermined value, and a condition that a dwell time in the save operation state exceeds a predetermined value is satisfied, the control unit causes the first correction unit to transition from the save operation state to the full operation state, and when the repetitive operation of the decoding is not performed in the save operation state, when the dwell time in the save operation state exceeds the predetermined value, the control unit causes the first correction unit to transition from the save operation state to the full operation state.

In order to solve the above problems, according to the present invention, there is provided an error correction method comprising a first correction step of performing error correction decoding of data by a repetitive operation, a step of estimating, using a decoding result in the first correction step, an input error rate in the first correction step and/or an output error rate indicating a residual error that cannot be corrected, and a step of performing, based on at least one piece of information of the input error rate, the output error rate, and an operation time in the first correction step, transition between a full operation state in which the repetitive operation of the error correction decoding is repeated until convergence is obtained and a save operation state in which the number of times of the repetitive operation of the error correction decoding is settable to a predetermined number of times as needed, and the number of times of the repetitive operation of the error correction decoding is restricted, as compared with that of the full operation state, wherein in the step of performing transition between the full operation state and the save operation state, in the full operation state, when at least one of a condition that the input error rate exceeds a predetermined value and a condition that the output error rate exceeds a predetermined value is satisfied, transition from the full operation state to the save operation state is performed, when the repetitive operation of the decoding is performed in the save operation state, when at least one of a condition that the input error rate is smaller than the predetermined value, a condition that the output error rate is smaller than the predetermined value, and a condition that a dwell time in the save operation state exceeds a predetermined value is satisfied, transition from the save operation state to the full operation state is performed, and when the repetitive operation of the decoding is not performed in the save operation state, when the dwell time in the save operation state exceeds the predetermined value, transition from the save operation state to the full operation state is performed.

Effect of the Invention

According to the present invention, it is possible to provide an error correction device that can improve a transmission characteristic while suppressing power consumption.

BEST MODE FOR CARRYING OUT THE INVENTION

Embodiments of the present invention will be described below with reference to the accompanying drawings.

<Optical Communication System>

Figure 1:
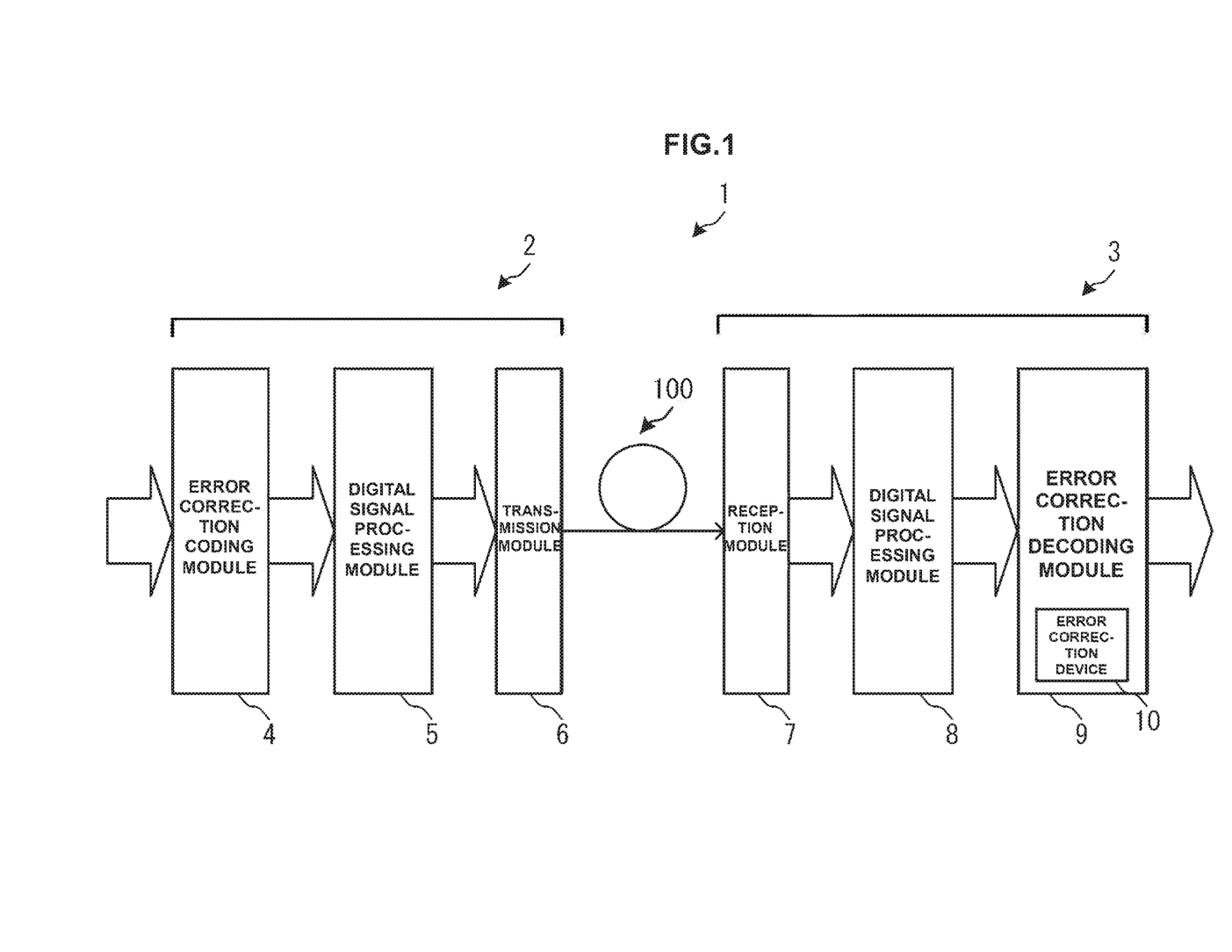
FIG. 1 is a view showing an example of the arrangement of an optical communication system including an error correction device according to the present invention.

An optical communication system 1 shown in FIG. 1 is formed by a transmission-side apparatus 2, an optical fiber transmission path 100, and a reception-side apparatus 3. The transmission-side apparatus 2 includes an error correction coding module 4 that performs error correction coding processing on an input signal, a digital signal processing module 5 that performs digital modulation and the like, and a transmission module 6 that performs multiplex processing and the like. On the other hand, the reception-side apparatus 3 includes a reception module 7 that performs signal demultiplexing and the like, a digital signal processing module 8 that performs optical/electrical conversion, waveform distortion compensation, and the like, and an error correction decoding module 9 that performs error correction decoding processing on the coded signal. An error correction device 10 according to the present invention is a device that is included in the error correction decoding module 9 of the reception-side apparatus 3 and performs error correction decoding on the signal having undergone error correction coding.

First Embodiment of Present Invention

Figure 2:
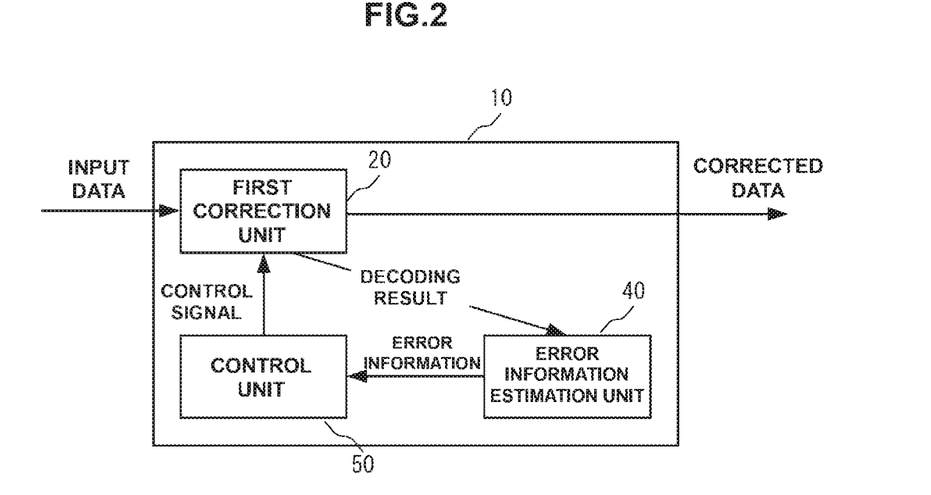
FIG. 2 is a block diagram showing an example of the arrangement of an error correction device according to the first embodiment of the present invention.

An error correction device 10 shown in FIG. 2 includes a first correction unit 20, an error information estimation unit 40, and a control unit 50. The first correction unit 20 is an error correction unit that executes error correction decoding on data by a repetitive operation. Power consumption increases in accordance with the number of times of the repetitive operation for decoding. Thus, when the error rate of an input signal is relatively high, the number of times of the repetitive operation is increased, resulting in greater power consumption. As error correction for executing error correction decoding by the repetitive operation, there are provided LDPC and turbo coding. The present invention, however, is not limited to them.

The error information estimation unit 40 estimates the input error rate of the first correction unit 20 as error information. Since an error of the input signal of the first correction unit 20 is corrected by the decoding operation of the first correction unit 20, the input error rate can be estimated from the decoding result of the first correction unit 20. For example, the input error rate is estimated by defining, as a bit error rate, "the number of correction bits/the total number of input bits" in the first correction unit 20.

Figure 3:
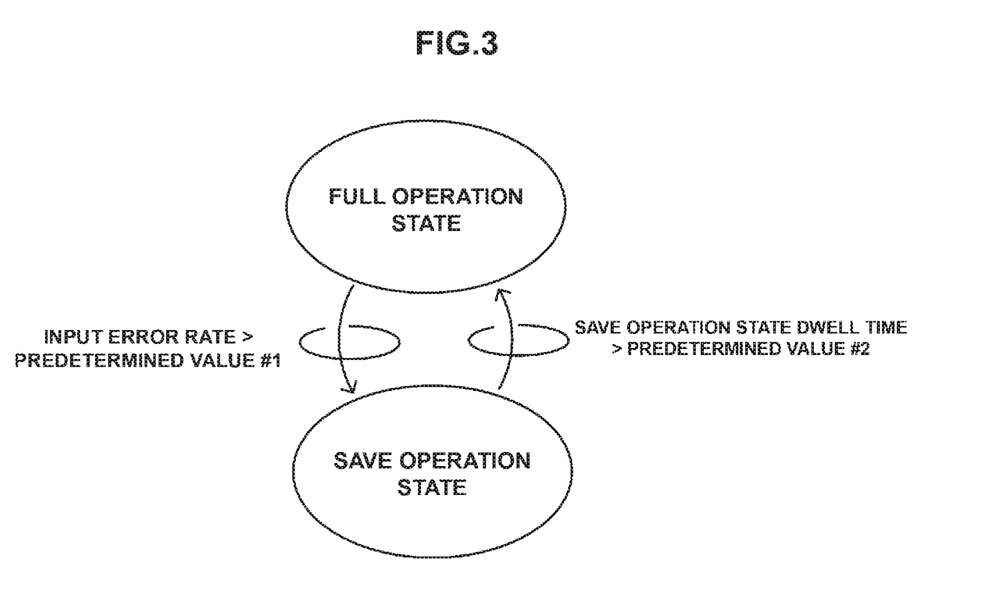
FIG. 3 is a view showing the operation state of a first correction unit according to the first embodiment of the present invention.

Referring to FIG. 3, a full operation state is a state in which the number of times of the repetitive operation for decoding in the first correction unit 20 is set to the limit of the processing capability of the circuit and the repetitive operation for decoding is repeated until convergence is obtained. On the other hand, a save operation state is a state in which the number of times of the repetitive operation for decoding in the first correction unit 20 is reduced, as compared with that of the full operation state, and is restricted to have a predetermined number of times. The number of times of the repetitive operation for decoding in the full operation state is not limited to the limit value of the circuit processing capability, and can be set to a value which is enough to ensure a desired error correction capability in accordance with the communication status on a transmission path. In addition, the number of times of the repetitive operation for decoding in the save operation state can be set as needed, and complete OFF (the number of times of the operation is zero) is allowed as a setting value.

Figure 4:
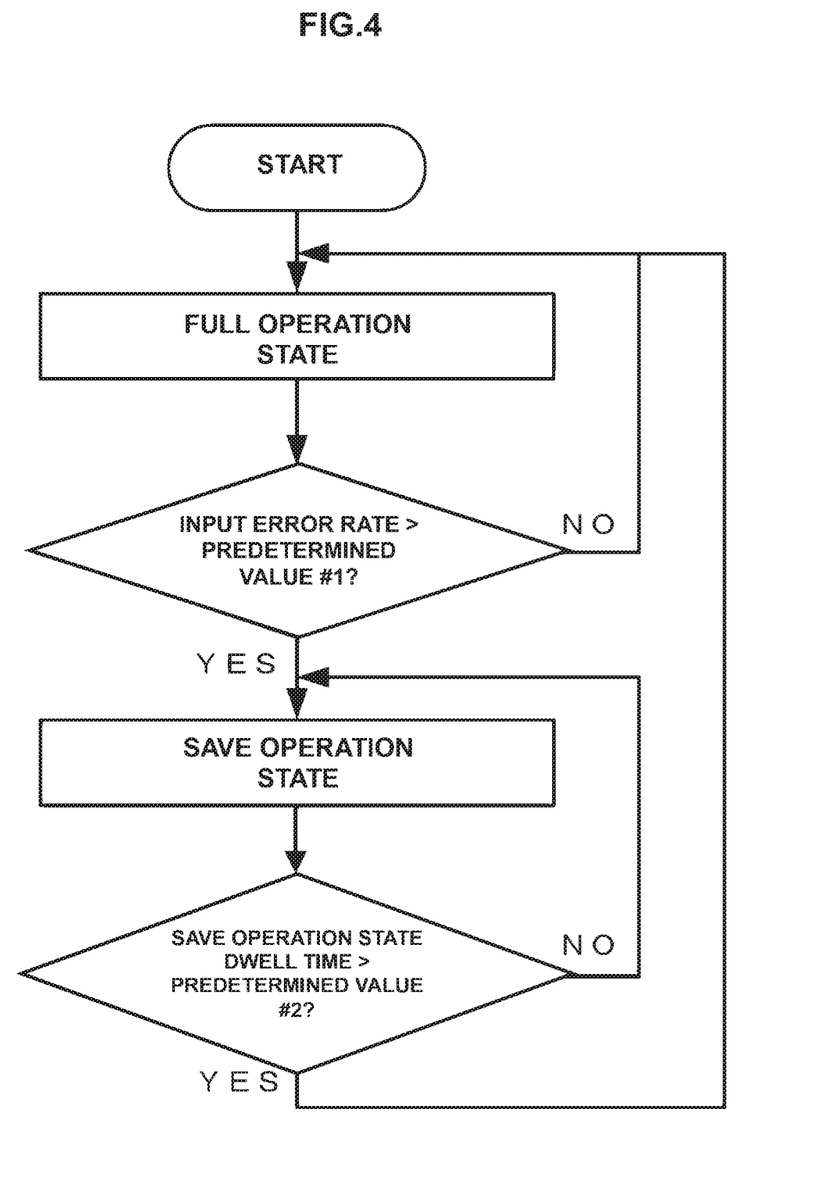
FIG. 4 is a flowchart illustrating transition of the operation state of the first correction unit according to the first embodiment of the present invention.

Referring to FIG. 4, the control unit 50 controls the operation state of the first correction unit 20 based on the error information estimated by the error information estimation unit 40 and an operation time in the save operation state. The error information estimated by the error information estimation unit 40 indicates the input error rate estimated from the decoding result of the first correction unit 20. When the operation time in the save operation state corresponds to a dwell time in the save operation state, when "input error rate>predetermined value #1" holds in the full operation state, it is determined that the communication status on the transmission path exceeds the error correction capability of the first correction unit 20, and the control unit 50 causes the first correction unit 20 to transition to the save operation state. As the predetermined value #1, for example, a value corresponding to the error correction capability of the first correction unit 20 is set.

On the other hand, when "save operation state dwell time>predetermined value #2" holds in the save operation state, the control unit 50 causes the operation state of the first correction unit 20 to transition to the full operation state. By causing the operation state of the first correction unit 20 to transition to the full operation state every time the length of time of the predetermined value #2 elapses, the communication status of the transmission path recovers, and it can be determined, for every predetermined time, whether the correction capability of the first correction unit 20 is enabled. The predetermined value #2 is appropriately set in accordance with the communication status of the transmission path. For example, a value assuming that the communication status of the transmission path recovers can be set.

As described above, according to this embodiment, since it is configured to control the operation state of the first correction unit based on the input error rate of the first correction unit and the operation state dwell time, it is possible to implement optimization of error correction and power-consumption reduction with a simple arrangement even in a status in which the communication status of the transmission path exceeds the correction capability.

Note that in the above explanation of this embodiment, the input error rate is used as the error information. However, an output error rate can be used. In this case, for example, when the decoding operation of the first correction unit 20 can be performed, a BIP (Bit Interleaved Parity) value created in the decoding operation of the first correction unit can be used. BIP is a parity check method used for error detection, and is used to divide information into blocks and detect whether there is an error in each block. By using the BIP value, it is possible to estimate an error rate in an output from the first correction unit. As a transition condition of the operation state of the first correction unit, a transition condition obtained by combining the dwell time and the input error rate or the output error rate can be used.

When the error information or the dwell time is compared with a predetermined value, continuation of a state satisfying the condition for a given set protection time or more may be set as a transition condition. This can implement stable control while reducing unstability of transition. The same applies to other embodiments.

Second Embodiment of Present Invention

Figure 5:
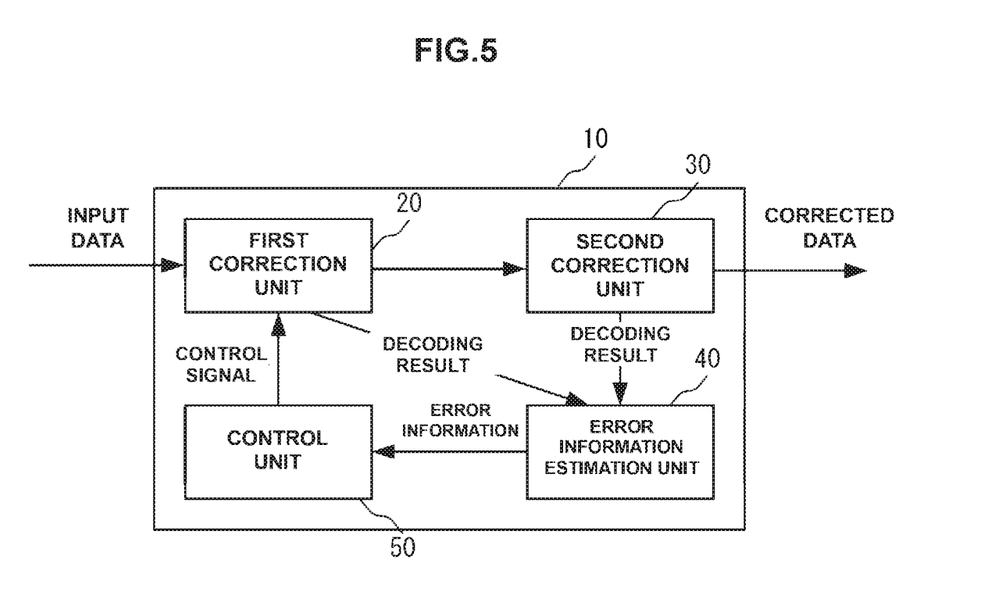
FIG. 5 is a block diagram showing an example of the arrangement of an error correction device according to the second embodiment of the present invention.

An error correction device 10 according to the second embodiment in FIG. 5 includes, in addition to a first correction unit 20 according to the first embodiment, a second correction unit 30 that performs error correction for an output from the first correction unit 20 to correct the residual error of the first correction unit 20. Similar to the first correction unit 20 shown in FIG. 1, the first correction unit 20 is an error correction unit that executes error correction decoding of data by a repetitive operation.

The second correction unit 30 is an error correction unit that corrects the residual error of the first correction unit 20. The second correction unit 30 is configured so that power consumption is lower than that of the first correction unit 20. For example, Reed-Solomon coding, BCH coding, or the like that does not perform a repetitive operation may be used. The present invention, however, is not limited to them.

An error information estimation unit 40 in the example shown in FIG. 5 estimates the output error rate of the first correction unit 20 as error information. The output error rate of the first correction unit 20 indicates an error rate in the output signal of the first correction unit 20. An error that cannot be corrected by the first correction unit 20 remains as a residual error in the output, and the residual error is corrected by the decoding operation of the second correction unit 30. Therefore, the output error rate of the first correction unit 20 can be estimated from the decoding result of the second correction unit 30. When, for example, the decoding operation of the second correction unit 30 is performed for each code having a predetermined length, whether the error is completely corrected or remained as the residual error, can be obtained by totalizing each code by "0" or "1", and "the number of codes in each of which the error remains/the total number of codes" can be defined as a code error rate, thereby estimating the output error rate.

The second correction unit 30 may estimate error information using the number of error correction bits obtained by totalizing the number of bits for which the error is corrected. Furthermore, when the decoding operation of the first correction unit 20 can be performed, error information may be estimated using a BIP value created in the decoding operation of the first correction unit 20.

Figure 6:
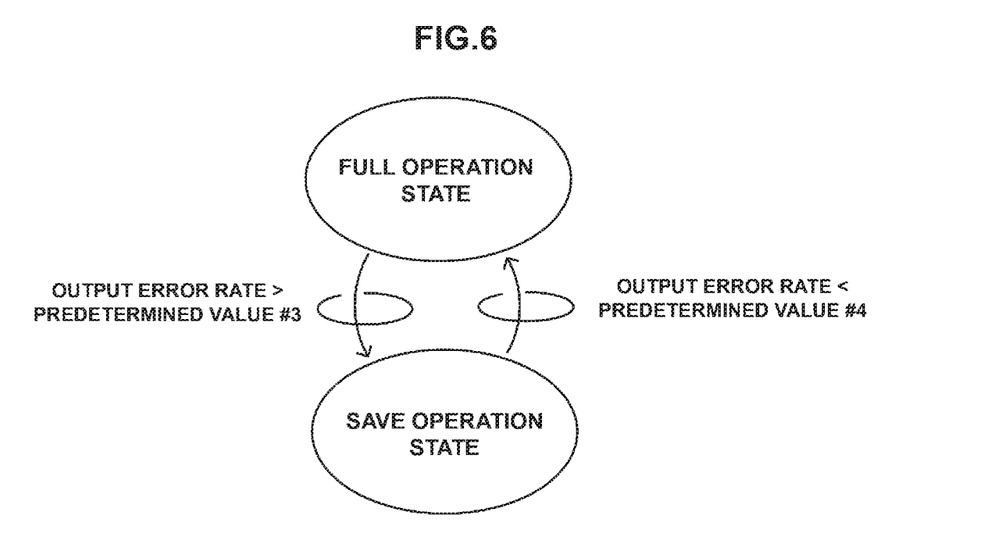
FIG. 6 is a view showing the operation state of a first correction unit according to the second embodiment of the present invention.

Referring to FIG. 6, similar to the first embodiment, a full operation state is a state in which the number of times of the repetitive operation for decoding in the first correction unit 20 is set to the limit of the processing capability of the circuit and the repetitive operation for decoding is repeated until convergence is obtained. On the other hand, a save operation state is a state in which the number of times of the repetitive operation for decoding in the first correction unit 20 is reduced, as compared with that of the full operation state, and the number of times of the repetitive operation for decoding is restricted to a predetermined number of times. The number of times of the repetitive operation for decoding in the full operation state is not limited to the limit value of the processing capability of the circuit, and can be set to a value which is enough to ensure a desired error correction capability in accordance with the communication status of a transmission path. In addition, the number of times of the repetitive operation for decoding in the save operation state can be set appropriately, and complete OFF (the number of times of the operation is zero) is allowed as a setting value.

Figure 7:
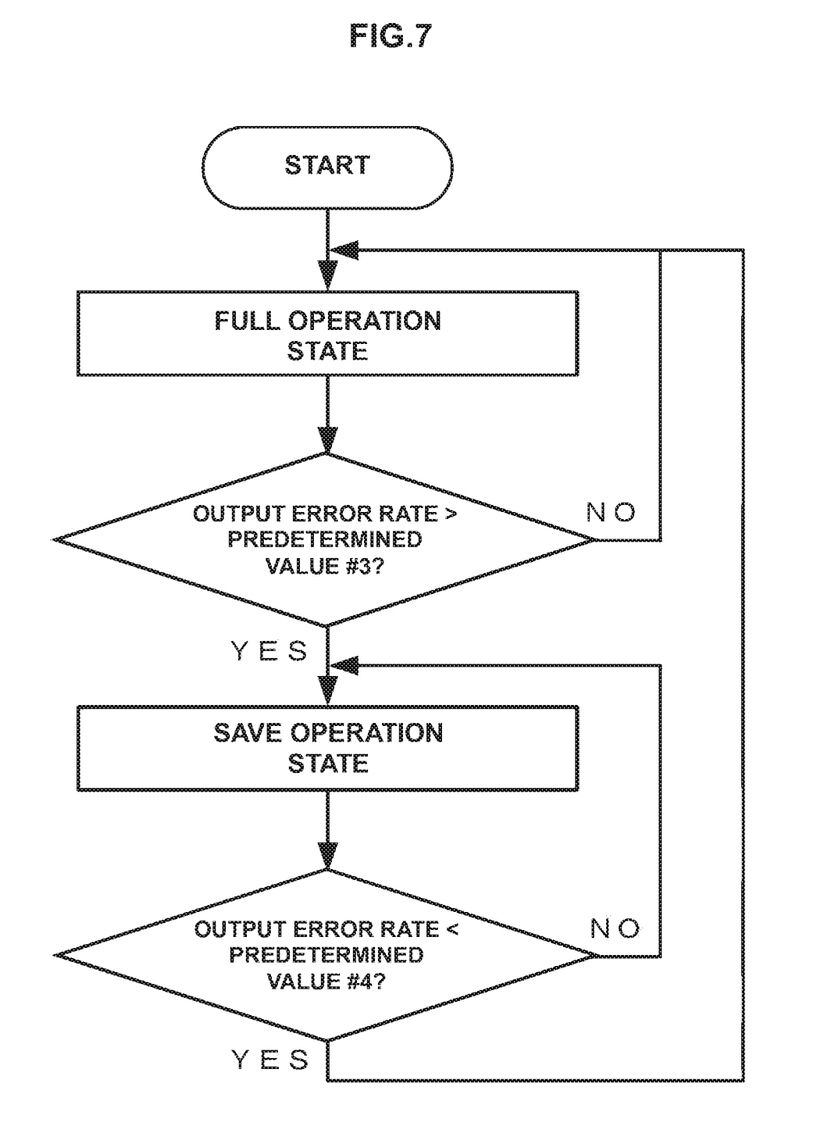
FIG. 7 is a flowchart illustrating transition of the operation state of the first correction unit according to the second embodiment of the present invention.

Referring to FIG. 7, a control unit 50 controls the operation state of the first correction unit 20 based on the error information estimated by the error information estimation unit 40 and an operation time in the save operation state. When the error information estimated by the error information estimation unit 40 indicates the output error rate of the first correction unit 20 calculated from the decoding result of the second correction unit 30, in case that "output error rate>predetermined value #3" holds in the full operation state, the control unit 50 determines that the operation of the first correction unit 20 is redundant, and causes the first correction unit 20 to transition to the save operation state. As the predetermined value #3, a relatively high error rate is set.

On the other hand, when "output error rate<predetermined value #4" holds in the save operation state, the control unit 50 determines that error correction is possible in the first correction unit 20, and causes the operation state of the first correction unit to transition to the full operation state. As the predetermined value #4, for example, a value corresponding to the error correction capability of the first correction unit 20 is set.

As described above, according to this example embodiment, since it is configured to estimate the output error rate of the first correction unit using the decoding result of the second correction unit with low power consumption, and control the operation state of the first correction unit, it is possible to implement optimization of error correction and power-consumption reduction even in a status in which the communication status of the transmission path exceeds the correction capability.

Note that in the above explanation of this embodiment, the output error rate is used as the error information. However, an input error rate can be used. Furthermore, as a transition condition when transitioning from the save operation state to the full operation state, a dwell time in the save operation state can be used. As a transition condition of the operation state of the first correction unit, the input error rate, the output error rate, a combination of the input error rate and the output error rate, or a transition condition obtained by combining the dwell time and the input error rate or the output error rate can be used.

Third Embodiment of Present Invention

The third embodiment of the present invention will be described with reference to FIGS. 8 and 9. In the third embodiment, a structure similar to that of the error correction device 10 according to the second embodiment is used. An error information estimation unit 40 has a function, described in the first embodiment, of estimating the input error rate of a first correction unit 20 as error information and a function, described in the second embodiment, of estimating the output error rate of the first correction unit 20 as error information. A control unit 50 controls the operation state of the first correction unit 20 based on the error information from the error information estimation unit 40 and an operation time in a save operation state, similar to each of the first and second embodiments.

Figure 8:
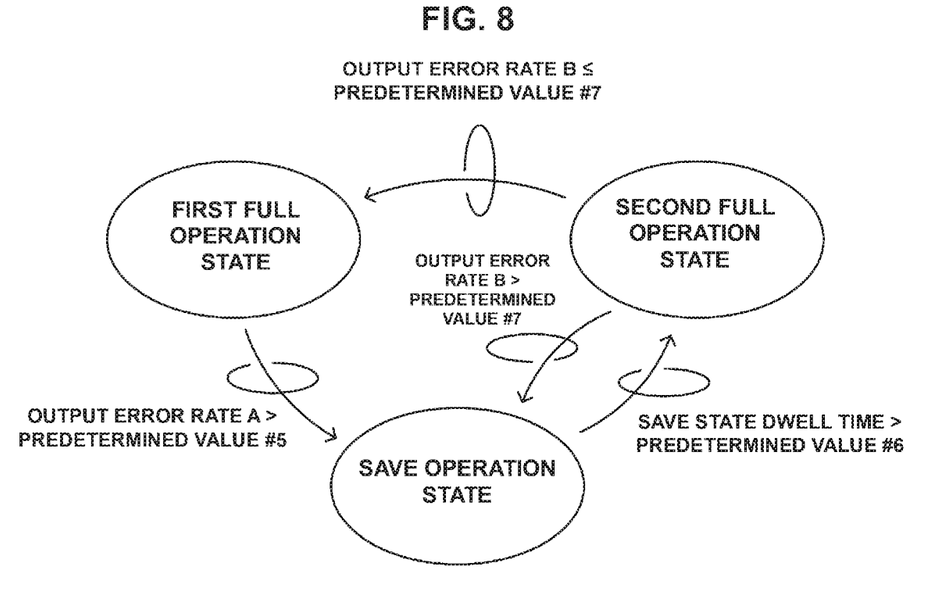
FIG. 8 is a view showing the operation state of a first correction unit according to the third embodiment of the present invention.

In the third embodiment shown in FIG. 8, the first correction unit 20 has the second full operation state in addition to the first full operation state. Similar to the full operation state in each of the first and second embodiments, the first and second full operation states are the states in which the number of times of the repetitive operation for decoding in the first correction unit 20 is set to the limit of the processing capability of the circuit and the repetitive operation for decoding is repeated until convergence is obtained. An error rate measurement time in the second full operation state is set shorter than that in the first full operation state, thereby making power consumption in the second full operation state lower than that in the first full operation state. The number of times of the repetitive operation for decoding in the full operation state is not limited to the limit value of the processing capability of the circuit, and can be set to a value which is enough to ensure a desired error correction capability in accordance with the communication status of a transmission path.

The save operation state is a state in which the number of times of a repetitive operation for decoding in the first correction unit 20 is reduced, as compared with the first and second full operation states, and the number of times of the repetitive operation for decoding is restricted to a predetermined number of times. The number of times of the repetitive operation for decoding in the save operation state can be set as needed, and complete OFF (the number of times of the operation is zero) is allowed as a setting value.

Referring to FIG. 8, an output error rate A indicates the output error rate of the first correction unit in the first full operation state, and is estimated based on a measurement result during a time T1 after the first correction unit 20 transitions to the first full operation state. On the other hand, an output error rate B indicates the output error rate of the first correction unit in the second full operation state, and is estimated based on a measurement result during a time T2 that is shorter in length than the time T1 after the first correction unit 20 transitions to the second full operation state. With respect to the time T1 and time T2, for example, the time T1 can be set to several msec, and the time T2 can be set to several hundred psec. As described in the second embodiment, the output error rates A and B of the first correction unit 20 can be estimated from the decoding result of the second correction unit 30 with power consumption lower than that of the first correction unit 20.

By setting the time T2 shorter in length than that of the time T1, the output error rate B in the second full operation state can be estimated by measurement of a time that is shorter than that of measurement of the output error rate A in the first full operation state, and it is thus possible to estimate the output error rate with lower power consumption. Note that the values of the time T1 and time T2 are not limited to the above-described example, and can be set appropriately in consideration of the balance between allowed power consumption and necessary measurement accuracy.

The control unit 50 controls the operation state of the first correction unit 20 based on the error information estimated by the error information estimation unit 40 and an operation time in the save operation state. In the example shown in FIGS. 8 and 9, the control unit 50 causes the operation state of the first correction unit 20 to transition based on the output error rates of the first correction unit 20 and a dwell time in the save operation state. As the output error rates, the output error rate A measured during the time T1 in the first full operation state and the output error rate B measured during the time T2 in the second full operation state are used.

Figure 9:
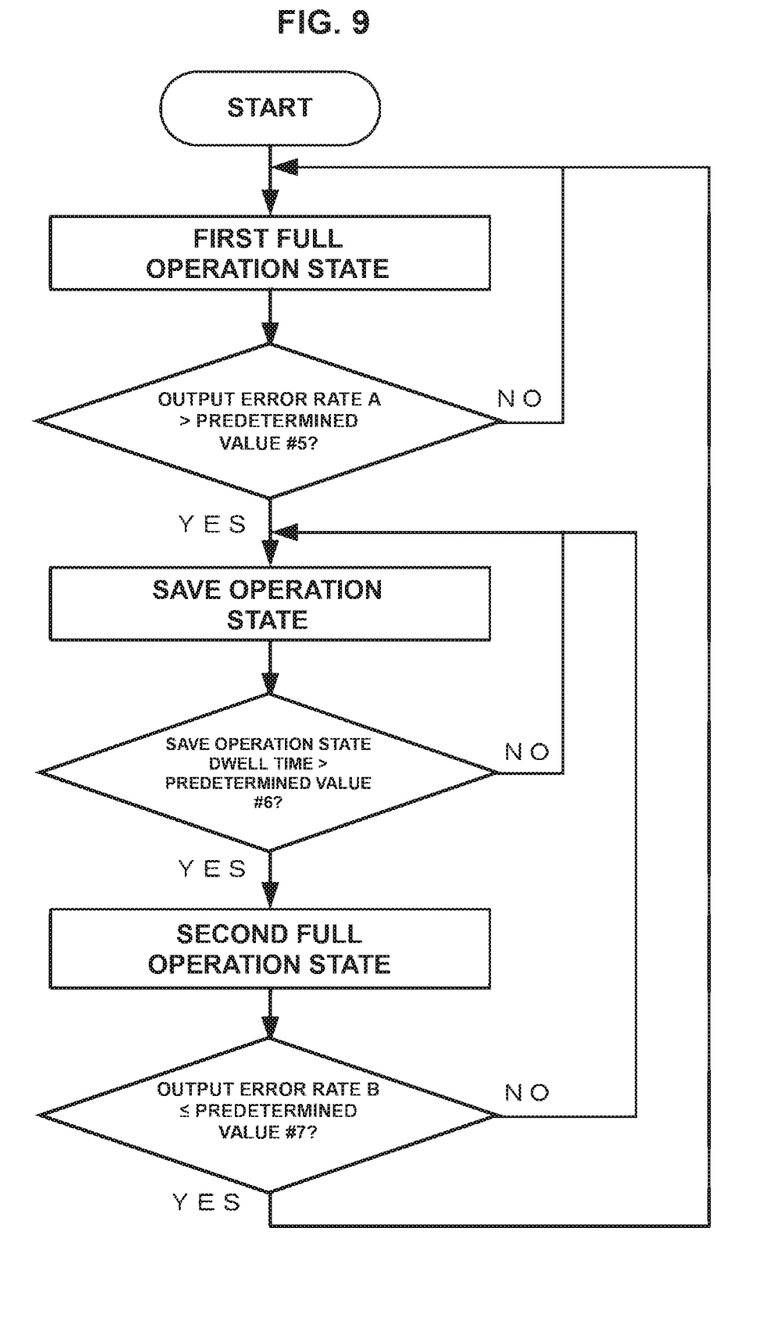
FIG. 9 is a flowchart illustrating transition of the operation state of the first correction unit according to the third embodiment of the present invention.

Referring to FIG. 9, when "output error rate A>predetermined value #5" holds in the first full operation state, the control unit 50 determines that the operation of the first correction unit 20 is redundant, and causes the first correction unit 20 to transition to the save operation state. In the save operation state, when "save operation state dwell time>predetermined value #6" holds, the control unit 50 causes the operation state of the first correction unit to transition to the second full operation state.

In the second full operation state, when "output error rate B predetermined value #7" holds, it is determined that error correction is possible in the first correction unit 20 and the operation state of the first correction unit 20 is caused to transition from the second full operation state to the first full operation state. On the other hand, when "output error rate B>predetermined value #7", it is determined that error correction is not possible in the full operation state, and the operation state is caused to transition to the save operation state. As described above, according to this embodiment, before transitioning to the first full operation state, it is confirmed in advance in the second full operation state whether error correction is possible in the first correction unit 20. By setting a shorter confirmation time in the second full operation state, it is possible to execute a confirmation operation with lower power consumption.

As described above, according to this embodiment, it is configured to estimate the output error rate of the first correction unit using the decoding result of the second correction unit with low power consumption, and control the operation state of the first correction unit. Thus, even in a case in which the communication status of a transmission path exceeds the correction capability, it is possible to implement optimization of error correction and power-consumption reduction.

Furthermore, in this embodiment, the second full operation state is provided in addition to the first full operation state, and it is confirmed whether error correction is possible in the first correction unit. Therefore, it is possible to make an attempt to further reduce power consumption, as compared with the second embodiment.

Note that in the above explanation of this embodiment, the output error rate is used as the error information. However, an input error rate can be used. As a transition condition of the operation state of the first correction unit, the input error rate, the output error rate, a combination of the input error rate and the output error rate, or a transition condition obtained by combining the dwell time and the input error rate or the output error rate can be used.

<Control of Number of Times of Repetitive Operation>

Figure 10:
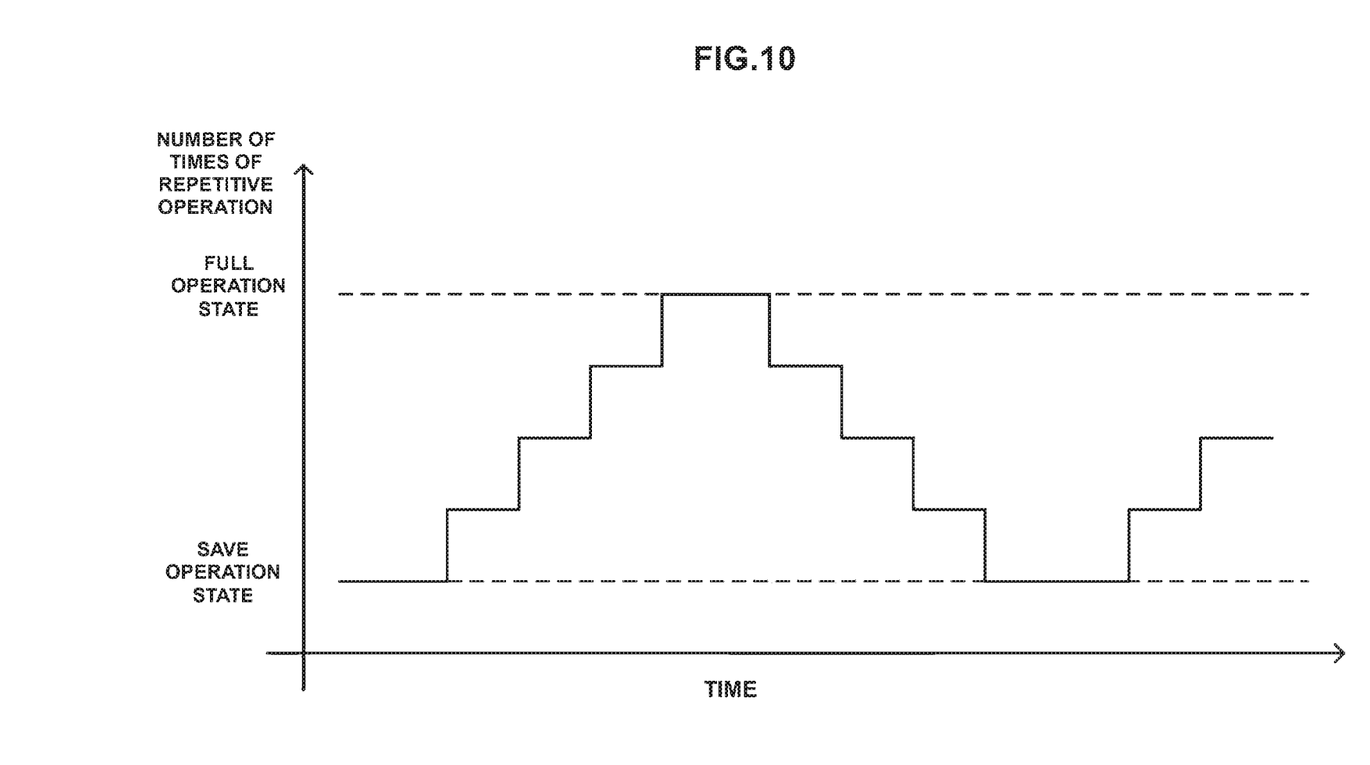
FIG. 10 is a timing chart showing an example of control of the number of times of a repetitive operation in error correction according to the embodiment of the present invention.

In an example shown in FIG. 10, control is executed to gradually increase, when the operation state of the first correction unit transitions from the save operation state to the full operation state, the number of times of the repetitive operation at the time of decoding by a predetermined step, and to gradually decrease, when the operation state transitions from the full operation state to the save operation state, the number of times of the repetitive operation at the time of decoding by a predetermined step. Thus, the temporal change of the number of times of the repetitive operation at the time of decoding becomes gentle, and it is possible to prolong the transition time between the full operation state and the save operation state.

An abrupt change of the number of times of the repetitive operation at the time of decoding causes an abrupt change of power consumption or a supply current, and causes an abrupt change of a supply voltage. Consequently, an adverse effect on the operation of another circuit sharing a supply power source is also concerned. As shown in FIG. 10, when the number of times of the repetitive operation at the time of decoding is gradually changed, it is possible to prevent an abrupt change in the supply voltage, and reduce the adverse effect on the operation of the other circuit. The steps to change the number of times of the repetitive operation and the transition time between the full operation state and the save operation state can be set appropriately. For example, the transition time can be set to several hundred psec.

INDUSTRIAL APPLICABILITY

The present invention can be used as an error correction device that can improve a transmission characteristic while suppressing power consumption in a coherent optical communication system.

EXPLANATION OF THE REFERENCE NUMERALS AND SIGNS

1 . . . optical communication system, 2 . . . transmission-side apparatus, 3 . . . reception-side apparatus, 4 . . . error correction coding module, 5 . . . digital signal processing module, 6 . . . transmission module, 7 . . . reception module, 8 . . . digital signal processing module, 9 . . . error correction decoding module, 10 . . . error correction device, 20 . . . first correction unit, 30 . . . second correction unit, 40 . . . error information estimation unit, 50 . . . control unit, 100 . . . optical fiber transmission path

The invention claimed is:
1. An error correction device comprising:
a first correction circuit configured to perform error correction decoding of data by a repetitive operation, including a full operation state in which the repetitive operation of the error correction decoding is repeated until convergence is obtained, and a save operation state in which the number of times of the repetitive operation of the error correction decoding is settable to a predetermined number of times as needed, and the number of times of the repetitive operation of the error correction decoding is restricted, as compared with that of the full operation state;
an error information estimation circuit configured to estimate, using a decoding result of the first correction circuit, an input error rate of the first correction circuit and/or an output error rate indicating a residual error that cannot be corrected; and
a control circuit configured to control transition between the full operation state and the save operation state of the first correction circuit based on at least one piece of information of the input error rate, the output error rate, and an operation time of the first correction circuit, wherein, in the full operation state, when at least one of a condition that the input error rate exceeds a predetermined value, and a condition that the output error rate exceeds a predetermined value is satisfied, the control circuit causes the first correction circuit to transition from the full operation state to the save operation state, when the repetitive operation of the decoding is performed in the save operation state, when at least one of a condition that the input error rate is smaller than the predetermined value, a condition that the output error rate is smaller than the predetermined value, and a condition that a dwell time in the save operation state exceeds a predetermined value is satisfied, the control circuit causes the first correction circuit to transition from the save operation state to the full operation state, and when the repetitive operation of the decoding is not performed in the save operation state, when the dwell time in the save operation state exceeds the predetermined value, the control circuit causes the first correction circuit to transition from the save operation state to the full operation state.

2. The error correction device according to claim 1, wherein when the input error rate of the first correction circuit exceeds a first predetermined value, the control circuit causes the first correction circuit to transition from the full operation state to the save operation state, and when the dwell time in the save operation state exceeds a second predetermined value, the control circuit causes the first correction circuit to transition from the save operation state to the full operation state.

3. The error correction device according to claim 2, wherein the input error rate of the first correction circuit is estimated based on the number of error correction bits in the decoding of the first correction circuit, and the output error rate of the first correction circuit is estimated based on a bit interleaved parity value in the decoding of the first correction circuit.

4. The error correction device according to claim 2, wherein in state transition between the full operation state and the save operation state of the first correction circuit, the number of times of the repetitive operation of the decoding of the first correction circuit is gradually increased or decreased.

5. The error correction device according to claim 2, wherein in state transition between the full operation state and the save operation state of the first correction circuit, the condition for causing the state transition includes the state that satisfies the condition to continue in the same state for equal to or greater than a predetermined length of time.

6. The error correction device according to claim 1, wherein the input error rate of the first correction circuit is estimated based on the number of error correction bits in the decoding of the first correction circuit, and the output error rate of the first correction circuit is estimated based on a bit interleaved parity value in the decoding of the first correction circuit.

7. The error correction device according to claim 6, wherein in state transition between the full operation state and the save operation state of the first correction circuit, the number of times of the repetitive operation of the decoding of the first correction circuit is gradually increased or decreased.

8. The error correction device according to claim 6, wherein in state transition between the full operation state and the save operation state of the first correction circuit, the condition for causing the state transition includes the state that satisfies the condition to continue in the same state for equal to or greater than a predetermined length of time.

9. The error correction device according to claim 1, further comprising a second correction circuit configured to perform error correction for a decoding output from the first correction circuit, having a lower power consumption than that of the first correction circuit, wherein the error information estimation circuit estimates the output error rate of the first correction circuit using a decoding result of one of the first correction circuit and the second correction circuit.

10. The error correction device according to claim 9, wherein in state transition between the full operation state and the save operation state of the first correction circuit, the condition for causing the state transition includes the state that satisfies the condition to continue in the same state for equal to or greater than a predetermined length of time.

11. The error correction device according to claim 9, wherein when the output error rate of the first correction circuit exceeds a third predetermined value, the control circuit causes the first correction circuit to transition from the full operation state to the save operation state, and when the output error rate is smaller than a fourth predetermined value, the control circuit causes the first correction circuit to transition from the save operation state to the full operation state.

12. The error correction device according to claim 11, wherein the input error rate of the first correction circuit is estimated based on the number of error correction bits in the decoding of the first correction circuit, and the output error rate of the first correction circuit is estimated based on one of a bit interleaved parity value in the decoding of the first correction circuit, a number of codes containing a residual error in decoding of the second correction circuit, and a number of error correction bits in decoding of the second correction circuit.

13. The error correction device according to claim 9, wherein the first correction circuit has a first full operation state and a second full operation state in which the repetitive operation of the error correction decoding is repeated until convergence is obtained, and the save operation state, when a first output error rate of the first correction circuit that is estimated, based on a measurement of the decoding result of the second correction circuit during a first time, as the error information from the error information estimation circuit, exceeds a fifth predetermined value, the control circuit causes the first correction circuit to transition from the first full operation state to the save operation state, when the dwell time in the save operation state exceeds a sixth predetermined value, the control circuit causes the first correction circuit to transition from the save operation state to the second full operation state, when a second output error rate of the first correction circuit that is estimated as the error information from the error information estimation circuit based on a measurement of the decoding result of the second correction circuit during a second time that is shorter than a length of the first time, when the second output error rate is smaller than a seventh predetermined value, the control circuit causes the first correction circuit to transition from the second full operation state to the first full operation state, and when the second output error rate is greater than the seventh predetermined value, the control circuit causes the first correction circuit to transition from the second full operation state to the save operation state.

14. The error correction device according to claim 13, wherein the input error rate of the first correction circuit is estimated based on the number of error correction bits in the decoding of the first correction circuit, and the output error rate of the first correction circuit is estimated based on one of a bit interleaved parity value in the decoding of the first correction circuit, a number of codes containing a residual error in decoding of the second correction circuit, and a number of error correction bits in decoding of the second correction circuit.

15. The error correction device according to claim 9, wherein the input error rate of the first correction circuit is estimated based on the number of error correction bits in the decoding of the first correction circuit, and the output error rate of the first correction circuit is estimated based on one of a bit interleaved parity value in the decoding of the first correction circuit, a number of codes containing a residual error in decoding of the second correction circuit, and a number of error correction bits in decoding of the second correction circuit.

16. The error correction device according to claim 9, wherein in state transition between the full operation state and the save operation state of the first correction circuit, the number of times of the repetitive operation of the decoding of the first correction circuit is gradually increased or decreased.

17. The error correction device according to claim 1, wherein in state transition between the full operation state and the save operation state of the first correction circuit, the number of times of the repetitive operation of the decoding of the first correction circuit is gradually increased or decreased.

18. The error correction device according to claim 1, wherein in state transition between the full operation state and the save operation state of the first correction circuit, the condition for causing the state transition includes the state that satisfies the condition to continue in the same state for equal to or greater than a predetermined length of time.

19. An optical communication system comprising an error correction device defined in claim 1.

20. An error correction method comprising:
a correction step of performing, by a correction circuit, error correction decoding of data by a repetitive operation;
a step of estimating, by an error information estimation circuit, using a decoding result in the correction step, an input error rate in the correction step and/or an output error rate indicating a residual error that cannot be corrected; and
a step of performing, by a control circuit, based on at least one piece of information of the input error rate, the output error rate, and an operation time in the correction step, transition between a full operation state in which the repetitive operation of the error correction decoding is repeated until convergence is obtained, and a save operation state in which the number of times of the repetitive operation of the error correction decoding is settable to a predetermined number of times as needed, and the number of times of the repetitive operation of the error correction decoding is restricted, as compared with that of the full operation state,
wherein in the step of performing transition between the full operation state and the save operation state,
in the full operation state, when at least one of a condition that the input error rate exceeds a predetermined value and a condition that the output error rate exceeds a predetermined value is satisfied, transition from the full operation state to the save operation state is performed,
when the repetitive operation of the decoding is performed in the save operation state, when at least one of a condition that the input error rate is smaller than the predetermined value, a condition that the output error rate is smaller than the predetermined value, and a condition that a dwell time in the save operation state exceeds a predetermined value is satisfied, transition from the save operation state to the full operation state is performed, and
when the repetitive operation of the decoding is not performed in the save operation state, when the dwell time in the save operation state exceeds the predetermined value, transition from the save operation state to the full operation state is performed.

* * * * *